US012796050B2

United States Patent

(12) United States Patent
Cai et al.

(10) Patent No.: US 12,796,050 B2
(45) Date of Patent: Nov. 10, 2026

(54) SEMICONDUCTOR STRUCTURE WITH SELF-ALIGNED CONDUCTIVE FEATURES

(71) Applicant: Taiwan Semiconductor Manufacturing Company, Ltd., Hsin-Chu (TW)

(72) Inventors: Chung-Hao Cai, Hsinchu (TW); Chao-Hsun Wang, Taoyuan County (TW); Chia-Hsien Yao, Hsinchu City (TW); Wang-Jung Hsueh, New Taipei City (TW); Yen-Jun Huang, Hsinchu (TW); Fu-Kai Yang, Hsinchu City (TW); Mei-Yun Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 663 days.

(21) Appl. No.: 18/298,629

(22) Filed: Apr. 11, 2023

(65) Prior Publication Data

US 2024/0038855 A1 Feb. 1, 2024

Related U.S. Application Data

(60) Provisional application No. 63/393,109, filed on Jul. 28, 2022.

(51) Int. Cl.

| | |
|---|---|
| ***H10D 64/23*** | (2025.01) |
| ***H10D 64/01*** | (2025.01) |
| ***H10P 50/00*** | (2026.01) |
| ***H10P 50/28*** | (2026.01) |

(52) U.S. Cl.

CPC ........... *H10D 64/251* (2025.01); *H10D 64/01* (2025.01); *H10P 50/283* (2026.01); *H10P 50/71* (2026.01)

(58) Field of Classification Search

None

See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |

(Continued)

FOREIGN PATENT DOCUMENTS

| | | |
|---|---|---|
| TW | 202008511 | 2/2020 |
| TW | 202017109 | 5/2020 |

(Continued)

*Primary Examiner* — Xiaoming Liu

(74) *Attorney, Agent, or Firm* — HAYNES AND BOONE, LLP

(57) ABSTRACT

A method of forming a semiconductor structure includes providing a semiconductor substrate having a source/drain feature and a gate structure formed thereon; forming an interlayer dielectric layer on the semiconductor substrate; patterning the interlayer dielectric layer to form a trench to expose the source/drain feature within the trench; forming a dielectric liner on sidewalls of the trench; filling a metal layer in the trench; recessing a portion of the metal layer in the trench, thereby forming a recess in the metal layer; and refilling a dielectric material layer in the recess.

20 Claims, 15 Drawing Sheets

(56) References Cited

U.S. PATENT DOCUMENTS

| | | | | |
|---|---|---|---|---|
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 2018/0315821 | A1* | 11/2018 | Xie | H10D 64/258 |
| 2020/0328154 | A1* | 10/2020 | Jiang | H10B 43/40 |
| 2021/0408231 | A1 | 12/2021 | Huang | |
| 2022/0051940 | A1* | 2/2022 | Lin | H01L 21/76843 |
| 2023/0059464 | A1* | 2/2023 | Tomczak | G03F 7/38 |

FOREIGN PATENT DOCUMENTS

| | | |
|---|---|---|
| TW | 202117818 | 5/2021 |
| TW | 202242971 | 11/2022 |

* cited by examiner

SEMICONDUCTOR STRUCTURE WITH SELF-ALIGNED CONDUCTIVE FEATURES

This application claims priority to U.S. Provisional Patent Application Ser. No. 63/393,109 filed Jul. 28, 2022, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance and misalignment among various conductive layers, which present performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
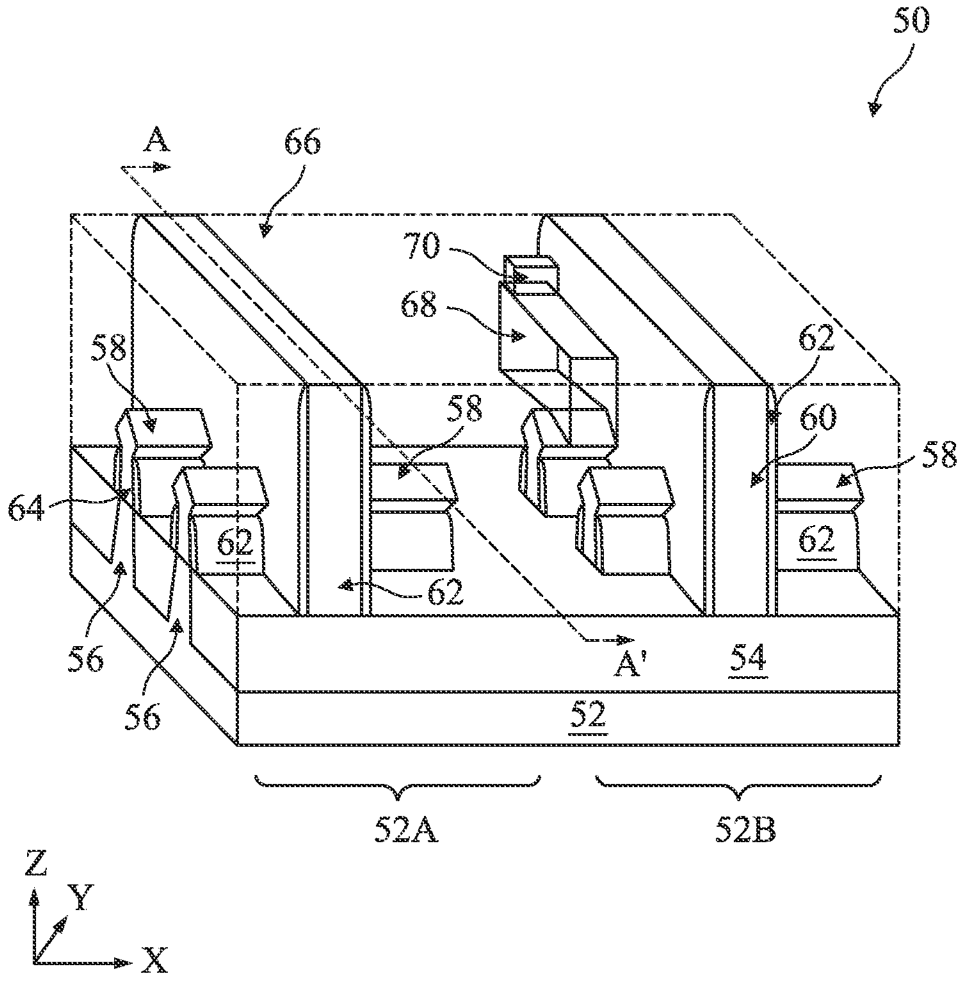
FIG. 1 is a perspective view of a semiconductor structure constructed according to various aspects of the present disclosure.

The present disclosure relates generally to integrated circuit (IC) devices, and more particularly, to multi-layer interconnect features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, MEOL and BEOL processes are experiencing significant challenges. For example, advanced IC technology nodes require more compact MLI features, which requires significantly reducing critical dimensions of interconnects of the MLI features (for example, widths and/or heights of vias and/or conductive lines of the interconnects). The reduced critical dimensions have led to significant increases in interconnect resistance, which can degrade IC device performance (for example, by increasing resistance-capacitance (RC) delay).

The present disclosure describes a self-aligned interconnect architecture formed on a source/drain feature. Particularly, the MLI structure includes metal lines distributed among multiple metal layers to provide horizontal routings and vias to provide vertical routings to metal lines of adjacent metal layers. For example, the MLI structure includes first metal lines of a first metal layer, second metal lines of a second metal layer over the first metal layer, . . . , $(n-1)^{th}$ metal lines of a $(n-1)^{th}$ metal layer, . . . , $n^{th}$ metal lines of a $n^{th}$ metal layer over $(n-1)^{th}$ metal layer, . . . and top metal lines of a top metal layer. Furthermore, the MLI structure includes contacts and vias below the first metal layer. Specifically, a contact is landing on the source/drain feature and a via is self-aligned with and is landing on the contact. The self-aligned architecture may lower capacitance on minimum pitch, reduce leakage. Self-aligned architecture may also manage low-R and low-C with Time Dependent Dielectric Breakdown test (TDDB) margin, lower power consumption, and boost speed. Different embodiments may have different advantages, and no particular advantage is required of any embodiment.

The present disclosure provides a structure and a method making the same to address the interconnect-related issues. FIG. 1 is a perspective view of a semiconductor structure 50, constructed in accordance with some embodiments. The semiconductor structure 50 may have a planar structure; multiple gate structure such as fin structure; or multiple-channel structure with multiple channels vertically stacked such as gate-all-around (GAA) structure. The following description uses a fin structure as an exemplary but it is not intended to be limiting and can be applied to any suitable structure without departure of the present disclosure.

The semiconductor structure 50 includes a semiconductor substrate 52 with various field effect transistors (FETs) formed thereon. Particularly, the semiconductor structure 50 includes a first region 52A with p-type FETs (PFETs) formed thereon and a second region 52B with n-type FETs (NFETs) formed thereon. The semiconductor structure 50 includes various isolation features 54, such as shallow trench isolation (STI) features. The semiconductor structure 50 also includes various fin active regions 56 formed on the semiconductor substrate 52. The fin active regions 56 are extruded above the isolation features 54, and are surrounded and isolated from each other by the isolation features 54. Various fin field effect transistors are formed on the fin active regions 56. In the present embodiments, PFETs are disposed on the fin active regions 56 within the first region 52A and NFETs are disposed on the fin active regions 56 within the second region 52B. In some embodiments, a silicon germanium (SiGe) layer is epitaxially grown on the semiconductor substrate 52 within the first region 52A to enhance the carrier mobility and device speed. Sources and drains 58 are formed on the fin active regions 56, and gate stacks 60 are formed on the fin active regions 56 and disposed between the corresponding source and drain 58. Each of the gate stacks 60 includes a gate dielectric layer and a gate electrode disposed on the gate dielectric layer. Dielectric spacers 62 may be further formed on sidewalls of the gate stacks 60 and sidewalls of the fin active regions 56 as well. A channel 64 is a portion of a fin active region 56 underlying the corresponding gate stack 60. The corresponding source and drain 58; the gate stack 60; and the channel 64 are coupled to a field effect transistor. In the present example illustrated in FIG. 1, the first region 52A includes two PFETs and the second region 52B includes two NFETs. Since the fin active regions 56 are extruded above the isolation features 54, the gate stacks 60 are coupled to the corresponding channel 64 more effectively through sidewalls and top surface of the fin active region 56, therefore enhancing the device performance.

The semiconductor structure 50 further includes an interlayer dielectric (ILD) layer 66 disposed on the fin active regions 56 and surrounding the gate stacks 60. The ILD layer 66 is drawn in dashed lines and is illustrated as transparent to have better viewing of various features, such as gate stacks 60 and the fin active regions 56. The ILD layer 66 includes one or more dielectric material films. The MLI structure is formed in the ILD layer 66 and is configured to couple various devices into an integrated circuit. In FIG. 1, the metal lines of the MLI structure are not shown and an exemplary conductive structure including a contact 68 landing on a source/drain feature 58 and a via 70 landing on the contact 68 is illustrated. Particularly, the via 70 is self-aligned with the contact 68 without overlay shift issues (such as short or open). Furthermore, the via 70 and the contact 68 have the same composition without an interface therebetween, which reduces the contact resistance. Although only one exemplary pair of contact 68 and via 70 are illustrated, more pairs of contacts 68 and vias 80 may be present according to various applications and layouts of the semiconductor structure 50. The semiconductor structure 50 and the method making the same are collectively described below.

Figure 2:
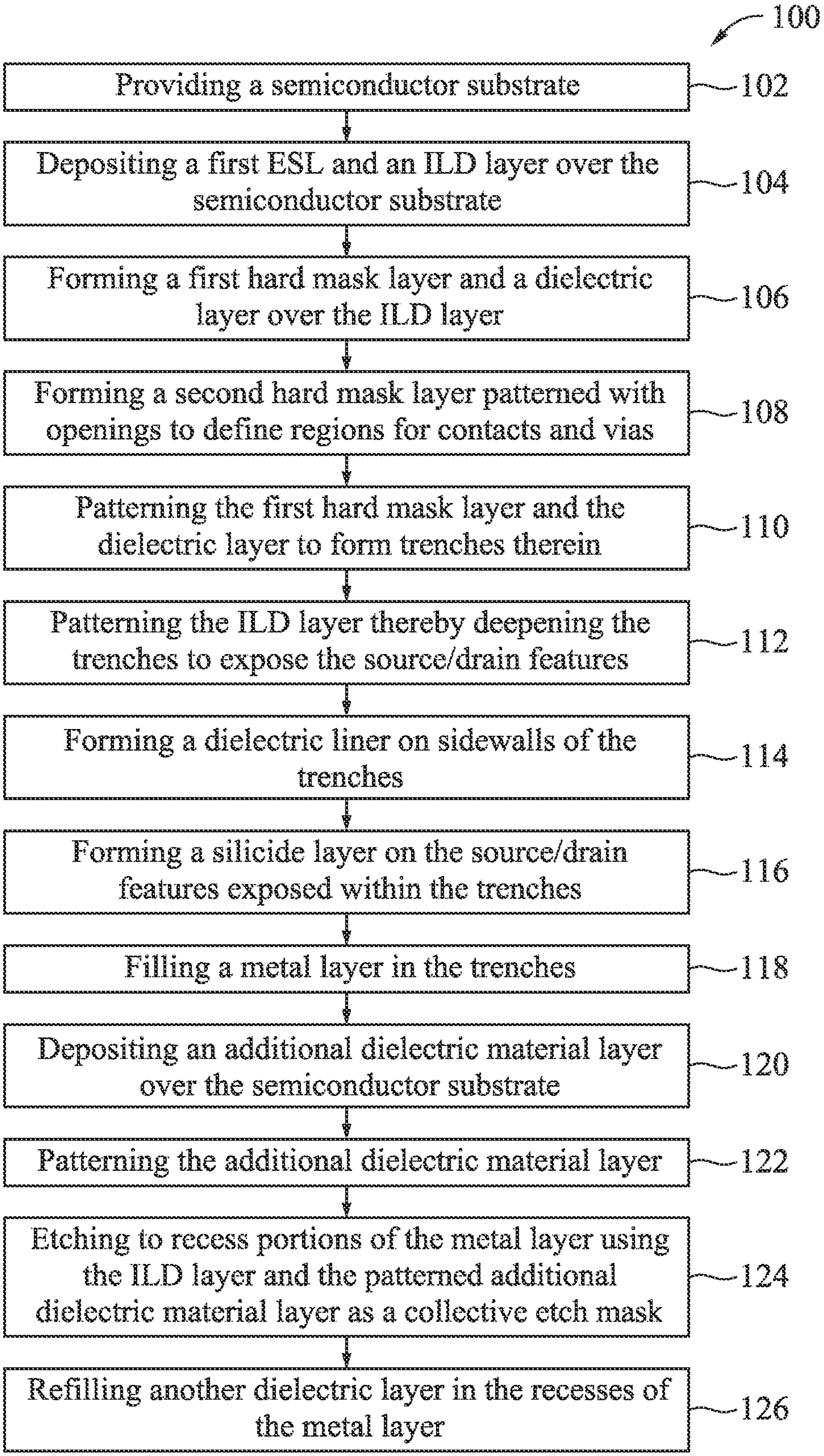
FIG. 2 is a flow chart of a method for fabricating the semiconductor structure of FIG. 1 according to various aspects of the present disclosure.
Figure 3A:
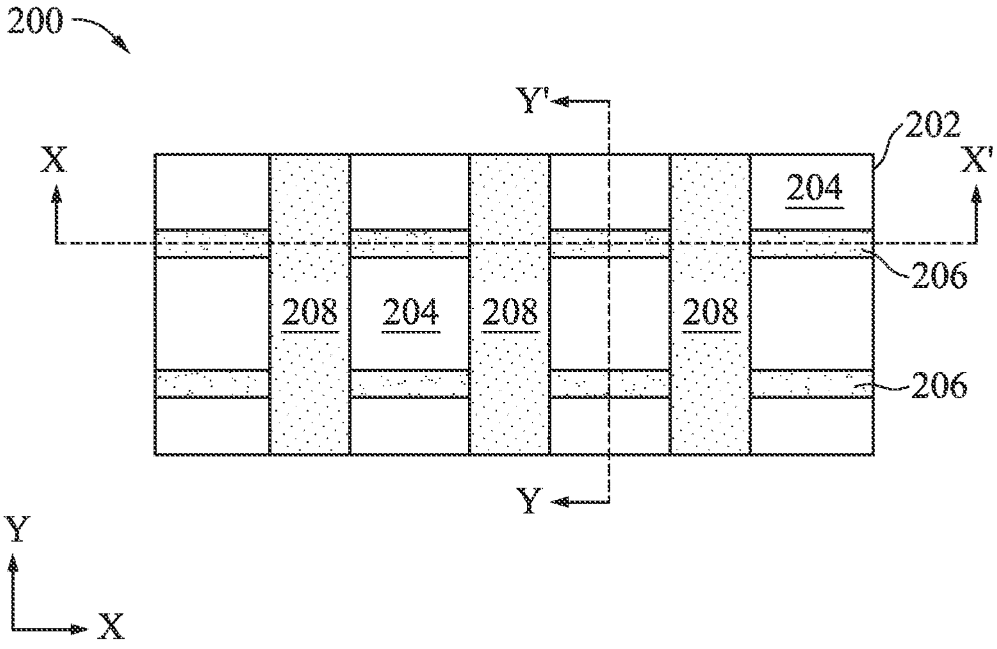
FIGS. 3A, 14 and 15 are top views of a semiconductor structure at various stages of fabrication, constructed according to various aspects of the present disclosure.
Figure 3B:
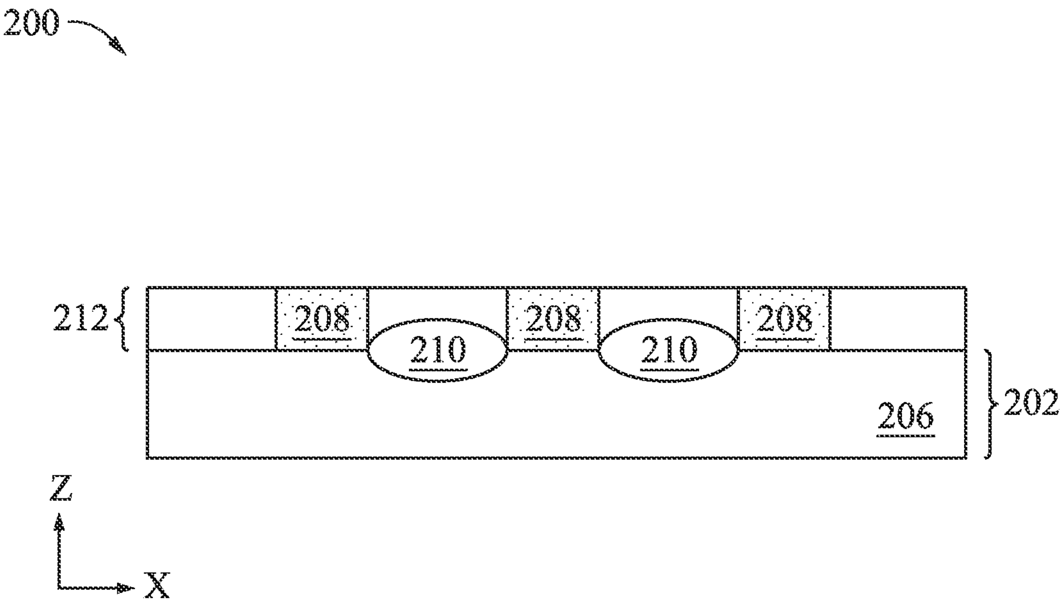
FIGS. 3B, 3C, 4A, 4B, 5A, 5B, 6A, 6B, 7A, 7B, 8A, 8B, 9A, 9B, 10A, 10B, 11A, 11B, 12A, 12B, 13A, and 13B are section views of the semiconductor structure at various stages of fabrication, according to various aspects of the present disclosure.
Figure 3C:
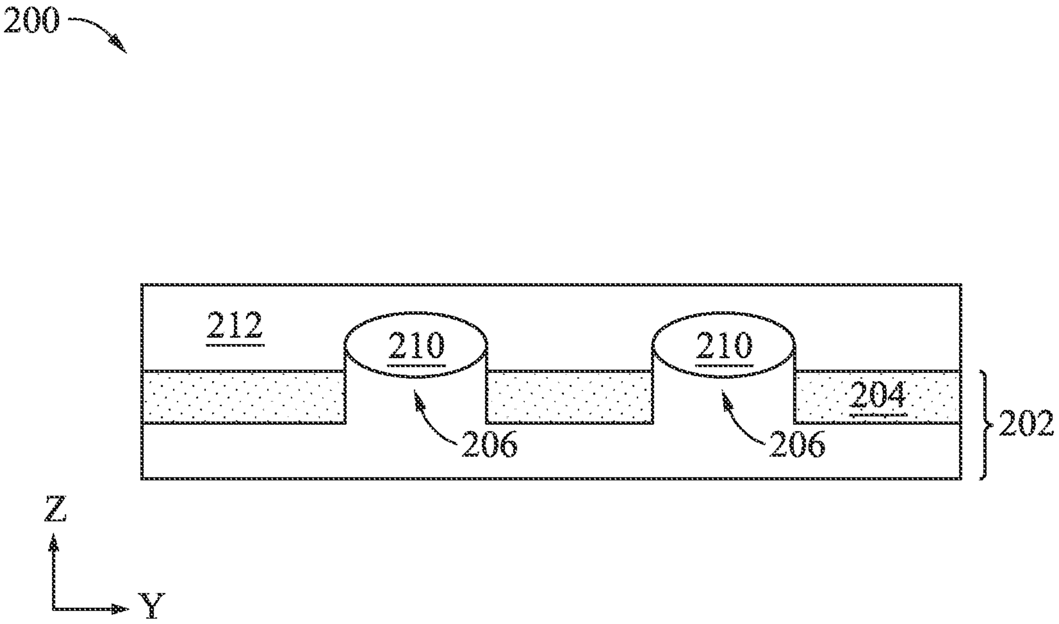
Figure 14:
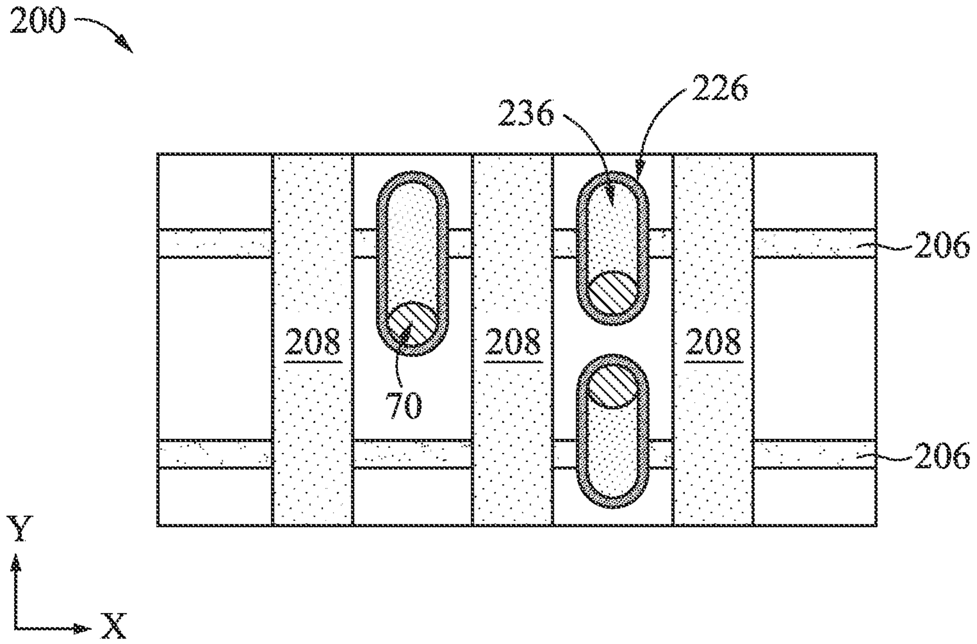
Figure 15:
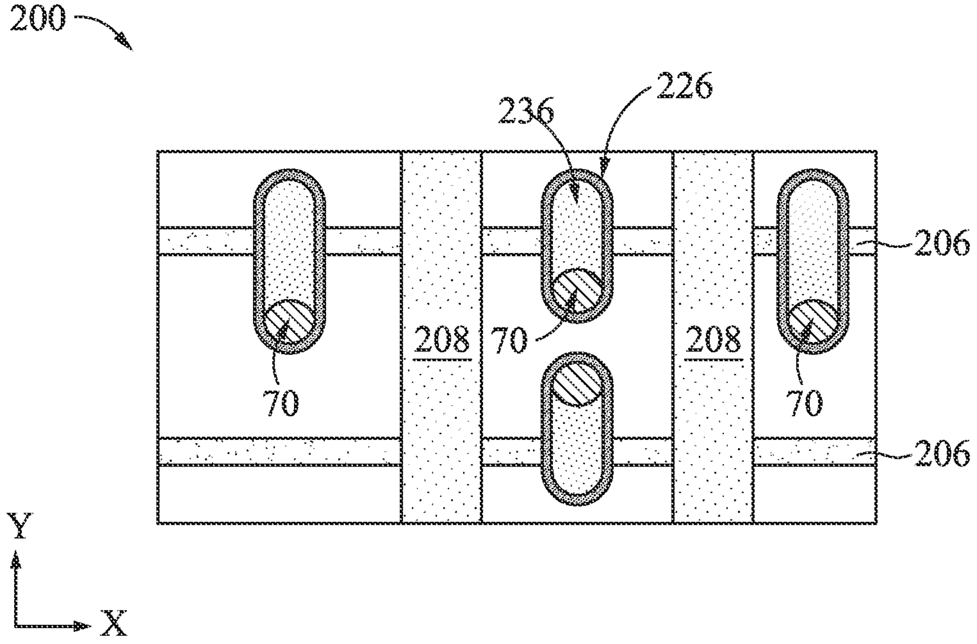

FIG. 2 illustrates a flowchart of a method 100 for fabricating a semiconductor structure 50 according to various aspects of the present disclosure. FIGS. 3A, 14 and 15 are top views of the semiconductor structure 200 at various fabrication stages, and FIGS. 3B-3C, 4A-4B, 5A-5B, 6A-6B, 7A-7B, 8A-8B, 9A-9B, 10A-10B, 11A-11B, 12A-12B, and 13A-13B are section views of a semiconductor structure 200 at various stages of fabrication according to various embodiments of method 100 of the present disclosure. Additional steps can be provided before, during, and after method 100, and some of the steps described can be moved, replaced, or eliminated for additional embodiments of method 100. Additional features can be added in the semiconductor structure depicted in FIGS. 3A-3C, 4A-4B, 5A-5B, 6A-6B, 7A-7B, 8A-8B, 9A-9B, 10A-10B, 11A-11B, 12A-12B, 13A-13B, 14, and 15, and some of the features described below can be replaced, modified, or eliminated in other embodiments of the semiconductor structure depicted in FIGS. 3A-3C, 4A-4B, 5A-5B, 6A-6B, 7A-7B, 8A-8B, 9A-9B, 10A-10B, 11A-11B, 12A-12B, 13A-13B, 14, and 15. The semiconductor structure 200 is a portion of the semiconductor structure 50 according to various embodiments.

FIG. 2 is a flowchart illustrating methods 100 of fabricating a semiconductor structure 200 according to various aspects of the present disclosure. The semiconductor structure 200 can be included in a microprocessor, a memory, and/or other IC devices. In some implementations, the semiconductor structure 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) or multi-channel transistors, such as GAA FETs.

FIGS. 3A-3C, 4A-4B, 5A-5B, 6A-6B, 7A-7B, 8A-8B, 9A-9B, 10A-10B, 11A-11B, 12A-12B, 13, and 14 have been simplified for the sake of clarity to better understand the inventive concepts of the present disclosure. Additional features can be added in the semiconductor structure 200, and some of the features described below can be replaced, modified, or eliminated in other embodiments of the semiconductor structure 200.

The semiconductor structure 200 may electrically couple various devices (for example, transistors, resistors, capacitors, and/or inductors) and/or components (for example, gate structures and/or source/drain features), such that the various devices and/or components can operate as specified by design requirements of the semiconductor structure 200. The semiconductor structure 200 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines (or metal lines). Vertical interconnect features typically connect horizontal interconnect features in different layers of the semiconductor structure 200. During operation, the interconnect features are configured to route signals between the devices and/or the components of the semiconductor device and/or distribute signals (for example, clock signals, voltage signals, and/or ground signals) to the devices and/or the components of the semiconductor device. Though the semiconductor structure 200 is depicted with a given number of dielectric layers and conductive layers, the present disclosure contemplates the semiconductor structure 200 having any number of dielectric layers and/or conductive layers.

Referring jointly to FIGS. 2, 3A, 3B and 3C, the method 100 of fabricating the semiconductor structure 200 include a block 102 where a semiconductor substrate or wafer 202 is provided. In some embodiments, the semiconductor substrate 202 may include silicon. In some embodiments, the substrate 202 may include another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 may include one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 202 can include various doped regions (not shown) configured according to design requirements of the semiconductor device, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, the substrate 202 may include doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping process can be performed to form the various doped regions.

In some embodiments, the substrate 202 may include isolation features 204. The isolation features 204 may be formed over and/or in the substrate 202 to isolate various device regions 206. Those device regions 206 include a semiconductor layer so that various doped features, such as source/drain features, can be formed thereon. Accordingly, those device regions 206 are also referred to as active regions (or active regions) 206. In the disclosed embodiment, the active regions 206 are fin-like active regions extruded above the isolation features 204. For example, isolation features 204 define and electrically isolate active regions from each other. Isolation features 204 include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features 204 include STI features. For example, STI features can be formed by etching a trench in the substrate 202 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

The semiconductor structure 200 also includes various gate structures 208. The gate structures 208 may be disposed over the substrate 202 and one or more gate structures may interpose a source and a drain, which are collectively referred to as source/drain features with a numeral 210, where a channel region is defined between the source and the drain 210. Source/drain feature may refer to a source or a drain, individually or collectively dependent upon the context. The one or more gate structures 208 engage the channel region, such that current can flow between the source/drain regions during operation. In some implementations, gate structures may be formed over a fin structure, such that gate structures each wrap a portion of the fin structure. For example, one or more of gate structures wrap channel regions of the fin structure, thereby interposing source regions and drain regions of the fin structure. In some embodiments, gate structures include metal gate (MG) stacks that are configured to achieve desired functionality according to design requirements of the semiconductor device. In some implementations, metal gate stacks may include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide ($k \approx 3.9$). Exemplary high-k dielectric materials may include hafnium, aluminum, zirconium, lanthanum, tantalum, titanium, yttrium, oxygen, nitrogen, other suitable constituent, or combinations thereof. In some implementations, the gate dielectric may include a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode may include multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer may include a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials may include TiN, TaN, Ru, Mo, Al, WN, $ZrSi_2$, $MoSi_2$, $TaSi_2$, $NiSi_2$, other p-type work function material, or combinations thereof. N-type work function materials may include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer may include metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In the disclosed embodiment, the gate structure further includes gate spacers disposed on sidewalls of the metal gate stacks.

The source/drain features 210 may be formed by epitaxial growth with a semiconductor material same or different from the substrate 202. For example, the source/drain features 210 for PFETs are epitaxially growth with silicon germanium and the source/drain features 210 for NFETs are epitaxially growth with silicon or silicon carbide for strain effect to enhance the carrier mobility. The formation of epitaxial source/drain features 210 may include etching to recess source/drain regions and epitaxially grow with one or more semiconductor material in the recessed source/drain regions of the active region 206. The gate structures 208 and epitaxial source/drain features 210 form a portion of a field effect transistor. Gate structure and/or epitaxial source/drain features are thus alternatively referred to as device features. In some implementations, epitaxial source/drain features wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable selective epitaxial growth (SEG) processes, or combinations thereof. Epitaxial source/drain features may be doped with n-type dopants and/or p-type dopants. In some implementations, where the transistor is configured as an n-type device (for example, having an n-channel), epitaxial source/drain features can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features can be silicon-and-germanium-containing epitaxial layers doped with boron, other p-type dopant, or combinations thereof (for example, forming Si:Ge:B epitaxial layers). In some implementations, annealing processes may be performed to activate dopants in epitaxial source/drain features.

An interlayer dielectric (ILD) layer 212 may be formed on the substrate 202. In some embodiments, the ILD layer 212 may be formed of any suitable dielectric material, including without limitation silicon oxide, silicon nitride, silicon oxynitride, tetraethyl orthosilicate (TEOS) formed oxide, phosphosilicate glass (PSG), boron-doped phosphosilicate glass (BPSG), low-k dielectric material, other suitable dielectric materials, or combinations thereof. Exemplary low-k dielectric materials may include fluorinated silica glass (FSG), carbon doped silicon oxide, Black Diamond® (Applied Materials of Santa Clara, California), Xerogel, Aerogel, amorphous fluorinated carbon, Parylene, SiLK (Dow Chemical of Midland, Michigan), polyimide, or combinations thereof. In some embodiments, the first ILD layer 212 may be formed by a deposition process (such as CVD, HDPCVD, MOCVD, RPCVD, PECVD, LPCVD, ALCVD, APCVD, FCVD, other suitable methods, or combinations thereof). After depositing the first ILD layer 212, a CMP process and/or other planarization process may be performed, such that the first ILD layer 212 has a substantially planar surface for enhancing formation of overlying layers. The ILD layer 212 is not shown in FIG. 3A so other underlying features can be illustrated in FIG. 3A.

Figure 4A:
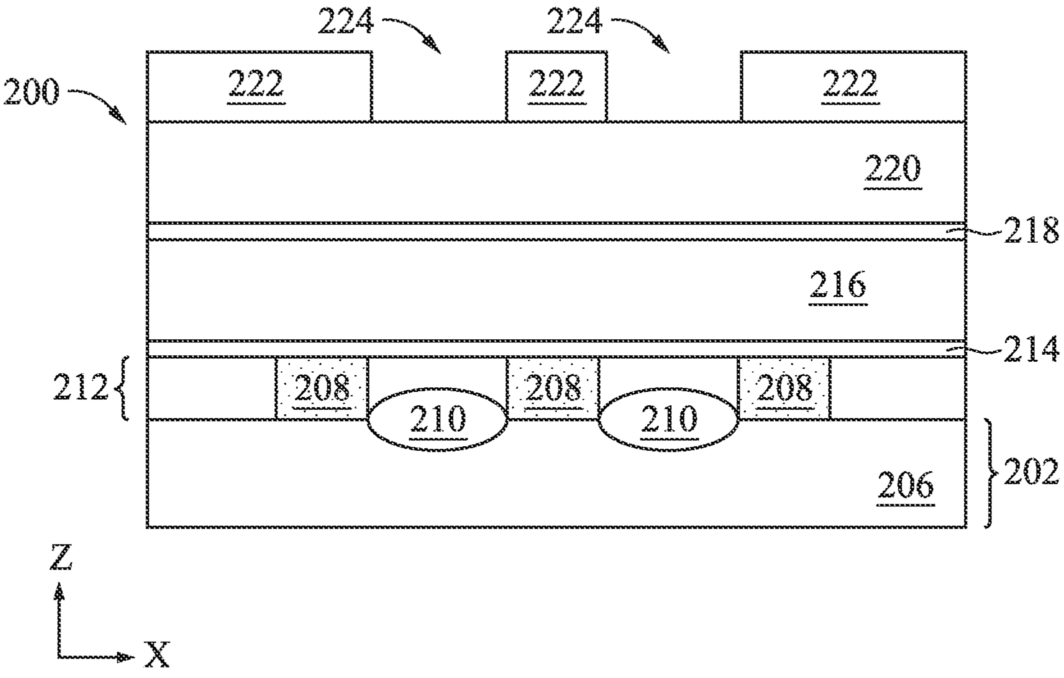
Figure 4B:
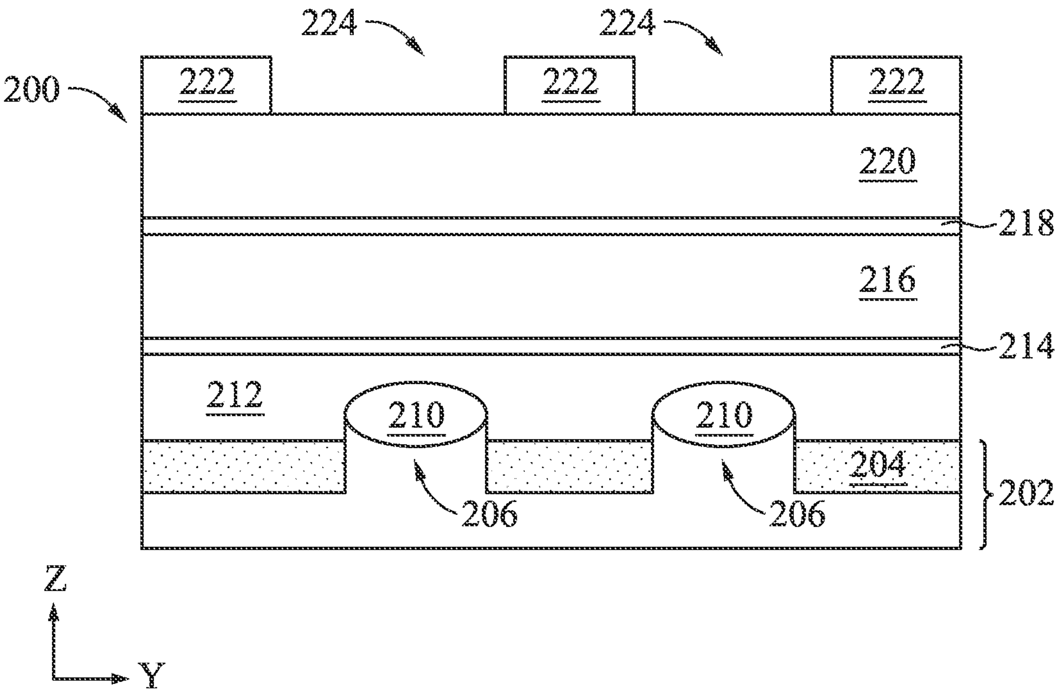

Referring to FIGS. 4A and 4B, the method 100 proceeds to form various material layers on the substrate 202, including an etch stop layer 214, and ILD layer 216. In some embodiments, the deposited material layers further include a first hard mask layer 218, a dielectric layer 220 such as silicon oxide layer, and a second hard mask 222, which are described below in detail.

Particularly, referring to FIGS. 2, 4A and 4B, the method 100 proceeds to block 104 by depositing a first etch stop layer (ESL) 214 and another ILD layer 216 over the semiconductor substrate 202. In some embodiments, the first ESL 214 may include silicon nitride. In some embodiments, the first ESL 214 includes any suitable dielectric material with a composition different from that of the ILD layers so to achieve etch selectivity and etch stop, such as silicon oxycarbide (SiOC), silicon nitrides (for example, SiCN, SiN, SiON), silicon carbides (for example, SiC), metal oxides, other suitable materials, or combinations thereof. In some embodiments, the first ESL 214 may be formed by a suitable deposition process such as CVD, ALD, HDPCVD, MOCVD, RPCVD, PECVD, LPCVD, ALCVD, APCVD, FCVD, other suitable methods, or combinations thereof. The ILD layer 216 is deposited on the first ESL 214. The ILD layer 216 is similar to the ILD layer 212 in terms of formation and composition. After depositing the first ESL 214 and the ILD layer 216, a CMP process and/or other planarization process may be performed, such that the ILD layer 216 has a substantially planar surface for enhancing formation of overlying layers.

Still referring to FIGS. 2, 4A and 4B, the method 100 proceeds to block 106 by forming a first hard mask layer 218 and a dielectric layer 220 over the ILD layer 216. The first hard mask layer 218 may include any suitable material with a composition different from the overlying and underlying materials so to achieve etch selectivity. In some embodiments, the first hard mask layer 218 includes a metal oxide (such as aluminum oxide, hafnium oxide or titanium oxide), a metal nitride (such as titanium nitride or aluminum nitride), other suitable dielectric layer (such as silicon oxynitride) or a combination thereof. In some embodiments the first hard mask layer 218 may be deposited using PVD, CVD, ALD, other suitable deposition process, or combinations thereof.

A dielectric material layer 220 is formed on the first hard mask layer 218. In some embodiments, the dielectric material layer 220 includes silicon oxide and may be formed by a suitable deposition technique, such as CVD, flowable CVD, other deposition method or a combination thereof. The dielectric material layer 220 may include other suitable dielectric material such as silicon oxynitride.

Still referring to FIGS. 2, 4A and 4B, the method 100 proceeds to block 108 by forming a second hard mask layer 222 patterned with openings 224 to define regions for contacts 68 landing on the source/drain features 210. The operation to form the patterned hard mask layer 222 includes a suitable procedure, such as a procedure that further includes depositing a hard mask layer 222; forming a patterned photoresist layer by lithography; and etching the hard mask layer 222 using the patterned photoresist layer as an etch mask, thereby transferring the openings of the patterned photoresist layer to the hard mask layer 222.

An exemplary lithography process may include photoresist coating, exposure to ultra-violet (UV) radiation, post-exposure baking, developing photoresist, and hard baking. The patterned photoresist layer may be removed afterward the etching of the hard mask layer 222 by a suitable method, such as wet stripping or plasma ashing. Lithography patterning may also be implemented or replaced by other proper methods such as maskless photolithography, electron-beam writing, ion-beam writing, and molecular imprint. The etch process applied to the hard mask layer 222 may include dry etch, wet etch, or a combination thereof.

Figure 5A:
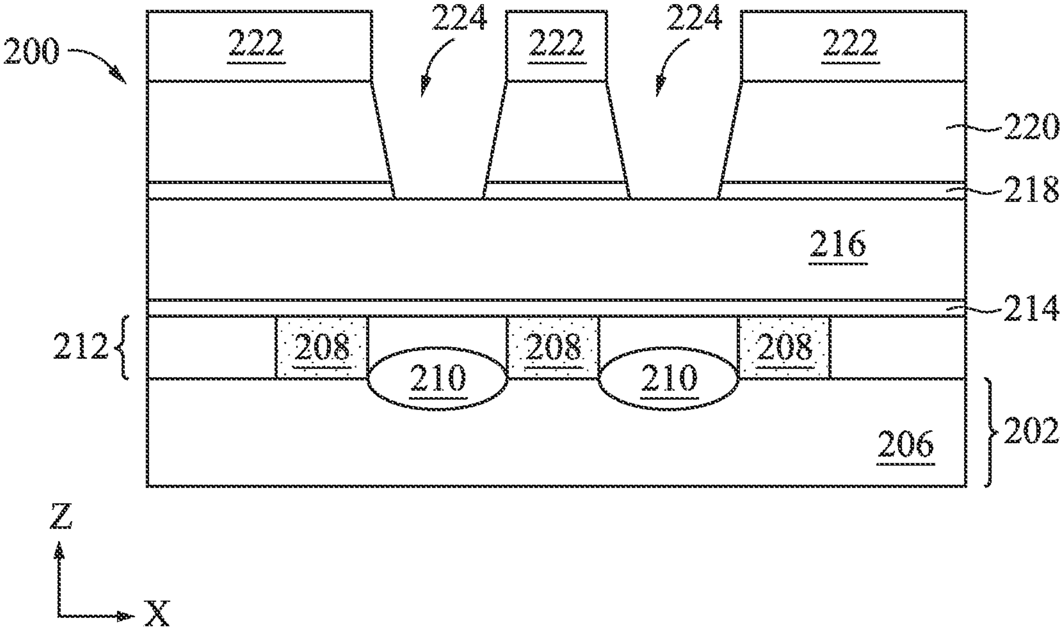
Figure 5B:
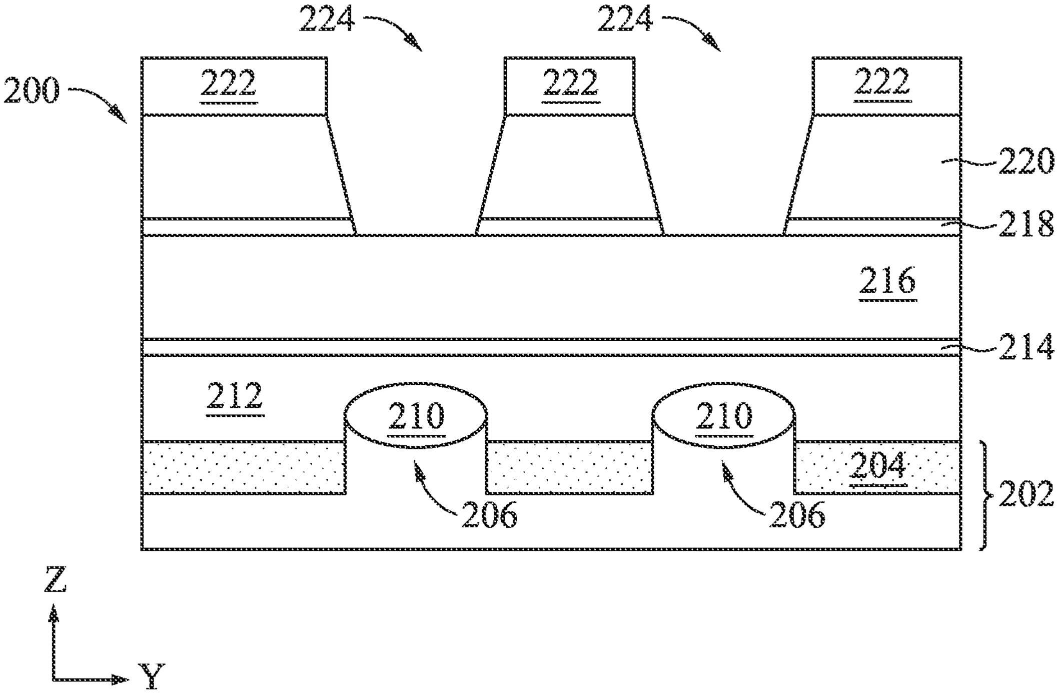

Referring to FIGS. 2, 5A and 5B, the method 100 proceeds to block 110 by patterning the dielectric layer 220 and the first hard mask layer 218 thereby extending the openings 224 into the dielectric layer 220 and the first hard mask layer 218. The extended openings 224 are also referred to as trenches 224. In some embodiments, patterning the dielectric layer 220 and the first hard mask layer 218 includes one or more etching processes with respective etchants to effectively remove respective materials within the trenches 224. In some embodiments, the etching process is performed in a single etching process. In some embodiments, the etching processes include applying hydrofluoric acid to etch the dielectric layer 220 that includes silicon oxide. In some embodiments, the etching processes include applying phosphoric acid ($H_3PO_4$) solutions to etch the hard mask layer 218 that includes silicon nitride. Thereafter, the second hard mask layer 222 may be removed by an etching process with proper etchant to selectively remove the second hard mask layer 222.

Figure 6A:
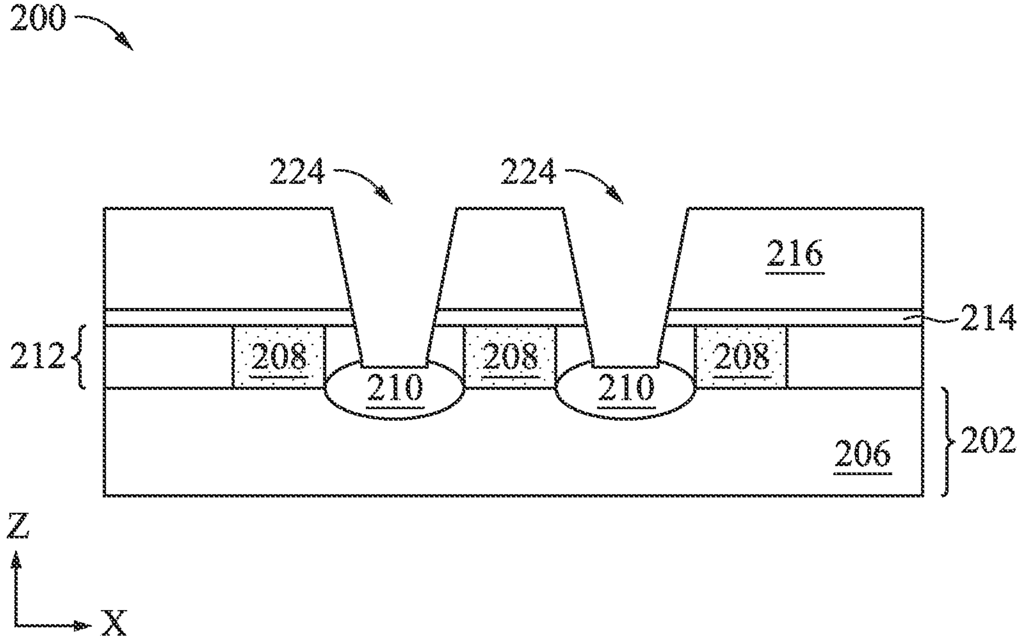
Figure 6B:
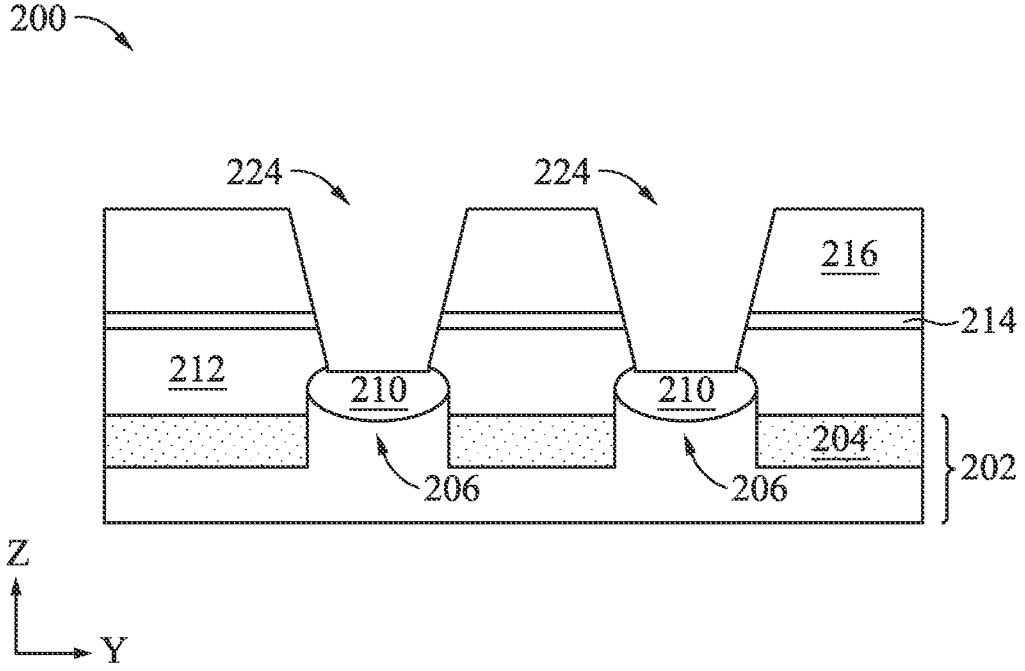

Referring to FIGS. 2, 6A and 6B, the method 100 proceeds to block 112 by patterning the ILD layers 212, 216 and the ESL 214 thereby further extending the trenches 224 therein such that the source/drain features 210 are exposed within the trenches 224. The patterning of the ILD layer 216 and the ESL 214 includes an etching process, such as dry etch, wet etch or a combination thereof, using the patterned dielectric layer 220 and hard mask layer 218 as an etch mask. In some embodiments, patterning the ILD layer 216 includes two etch steps: a first etching process with a first etchant to selectively etch the ILD layer 216 until it stops at the ESL 214; and a second etching process with a second etchant to selectively remove the ESL 214 within the trenches 224 so that the source/drain features 210 are exposed within the trenches 224. Thus, the trenches 224 for the contacts 68 are formed in the ILD layer 216. The formation of the trenches 224 employs various material layers and various patterning and etching processes. For example, the ESL 214 provides etch stop function so that the etching process applied to the ILD layer 216 is able to completely etch through the ILD layer 216 without damaging the substrate 202, particularly the source/drain features 210. In another example, the hard mask layer 218 and the dielectric layer 220 are further employed with additional etching processes to tune the profiles of the trenches 224 when the patterning process transfers the trenches 224 to the ILD layer 216. When various etching steps are applied to the hard mask 222, the dielectric layer 220, the hard mask 218, the ILD layer 216, the ESL 214, and the ILD layer 212, respectively, multiple etch steps use proper combinations of wet etches and dry etches with respective etchants each having a significant greater etch rate to an intended material layer. Particularly, multiple etch steps have freedoms to use proper combinations of wet etches and dry etches with respective etchants each having a different ratio of lateral etch rate/vertical etch rate, thereby modifying the profile of the trenches 224.

For example, the etch step applied to the ILD layer 216 includes a dry etch to substantially etch the ILD layer 216 vertically, the etch step applied to the ESL 214 includes a wet etch to open the ESL 214, such as hot phosphorous acid when the ESL 214 is silicon nitride; and the etch step applied to the ILD layer 212 includes a wet etch with significant lateral etch to substantially widen the trenches 224 in the ILD layer 212. After the trenches 224 are formed in the ILD layer 216, the dielectric layer 220 and the hard mask layer 218 are removed by one or more etching process.

Figure 7A:
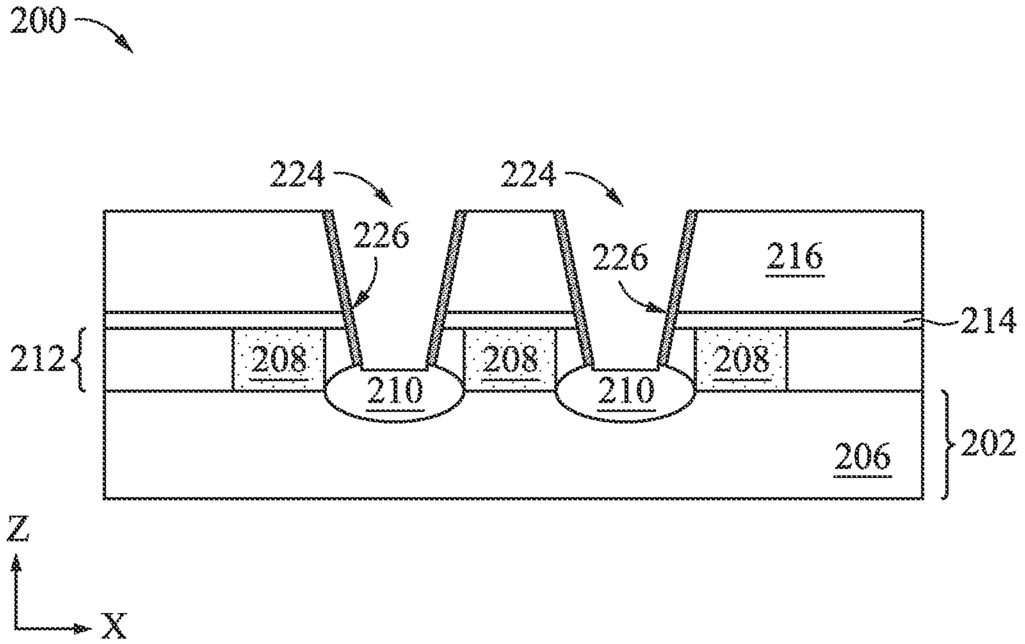
Figure 7B:
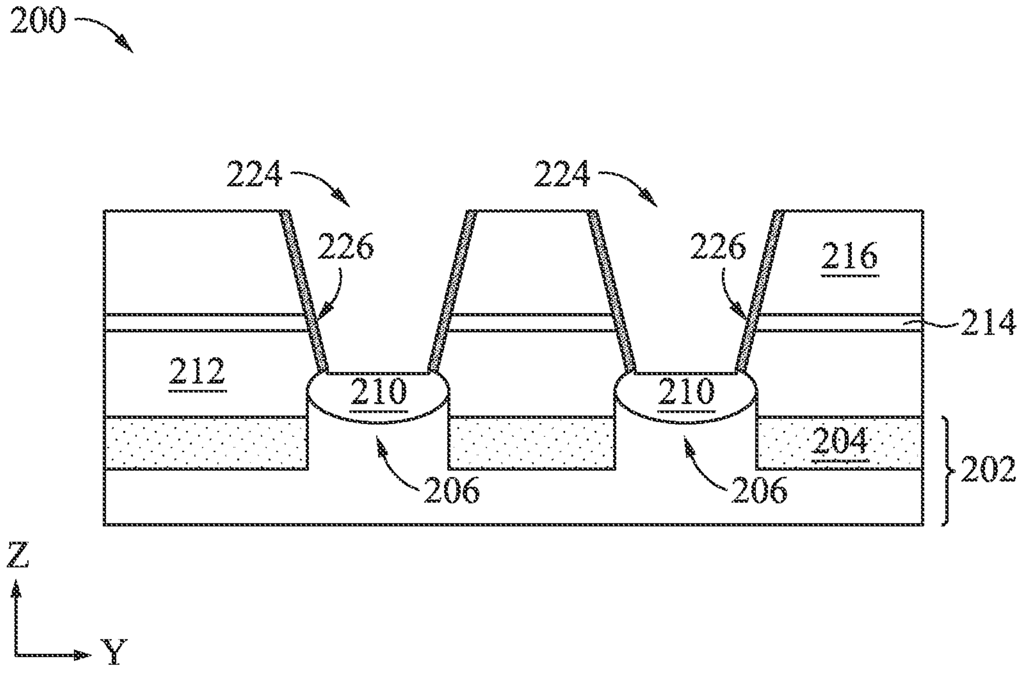

Referring to FIGS. 2, 7A and 7B, the method 100 proceeds to block 114 by forming a dielectric liner 226 on the sidewalls of the trenches 224. The dielectric liner 226 includes one or more suitable dielectric material to enhance the integration of the contacts 68 to be formed and the ILD layer 216 such as functioning to increase adhesion therebetween and preventing the contacts 68 from diffusion into the ILD layer 216. In some embodiments, the dielectric liner 226 includes silicon nitride, silicon oxynitride, other suitable dielectric material or a combination thereof. The dielectric liner 226 may be formed by deposition such as CVD and anisotropic etch such as plasma etch to remove the bottom portion of the dielectric liner 226.

Figure 8A:
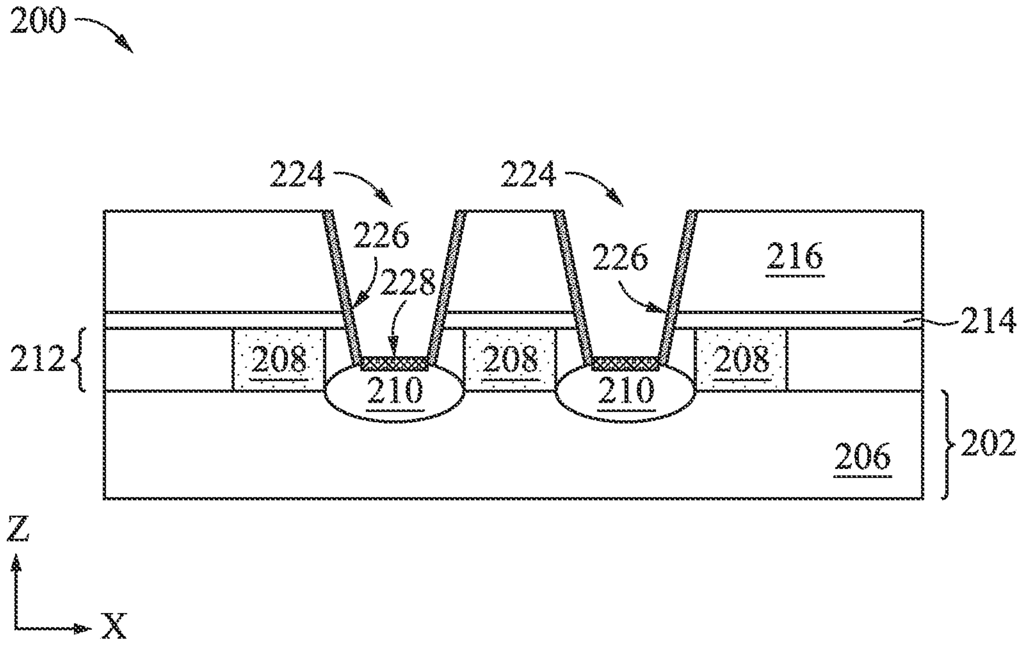
Figure 8B:
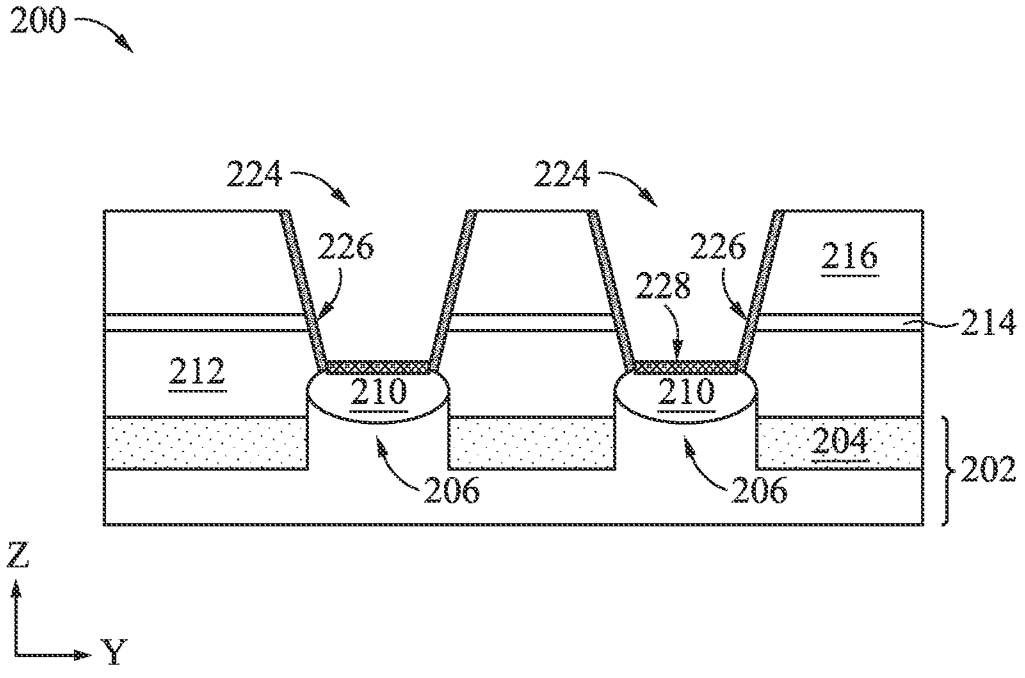

Referring to FIGS. 2, 8A and 8B, the method 100 may proceed to block 116 by forming a silicide layer 228 on the epitaxial source/drain features 210. The silicide layer 228 as a portion of a source/drain feature to reduce the contact resistance between the overlying contact (to be formed) and the epitaxial source/drain feature 210. In some implementations, silicide layers may be formed by self-aligned silicide (salicide) process that includes depositing a metal layer over epitaxial source/drain features 210; annealing to react the metal with silicon; and etching to remove unreacted the metal, therefore forming the silicide layer 228 self-aligned with the source/drain features 210. The metal layer includes any material suitable for promoting silicide formation, such as nickel, platinum, palladium, vanadium, titanium, cobalt, tantalum, ytterbium, zirconium, other suitable metal, or combinations thereof. The semiconductor structure 200 is then heated (for example, subjected to an annealing process) to cause constituents of epitaxial source/drain features (for example, silicon and/or germanium) to react with the metal.

The silicide layers thus include metal and a constituent of epitaxial source/drain features (for example, silicon and/or germanium). In some implementations, the silicide layers may include nickel silicide, titanium silicide, or cobalt silicide. Any un-reacted metal, such as remaining portions of the metal layer, is selectively removed by any suitable process, such as an etching process.

Figure 9A:
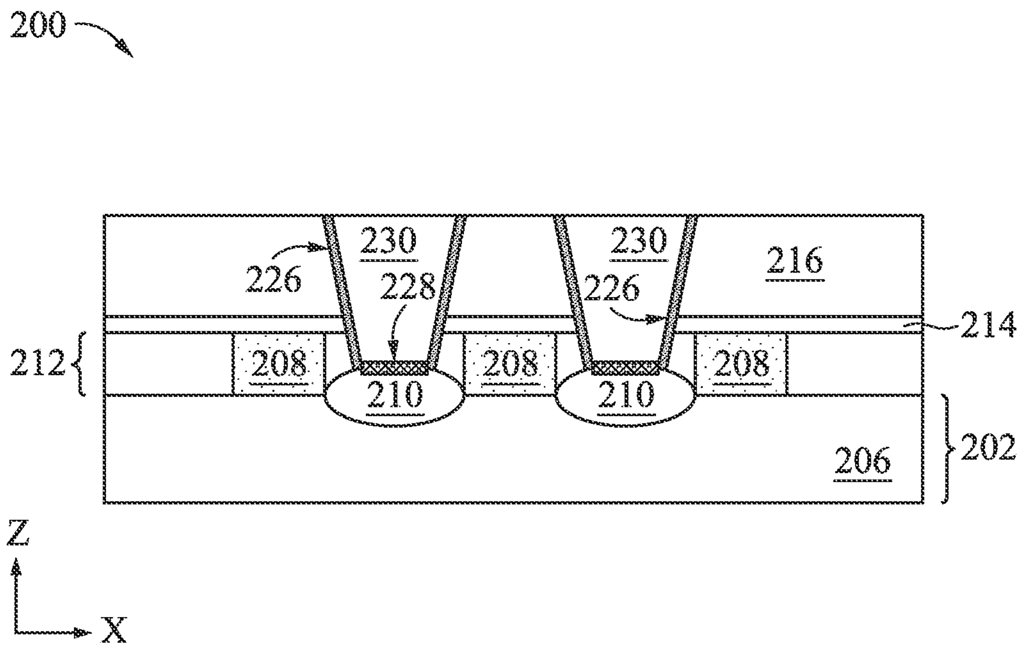
Figure 9B:
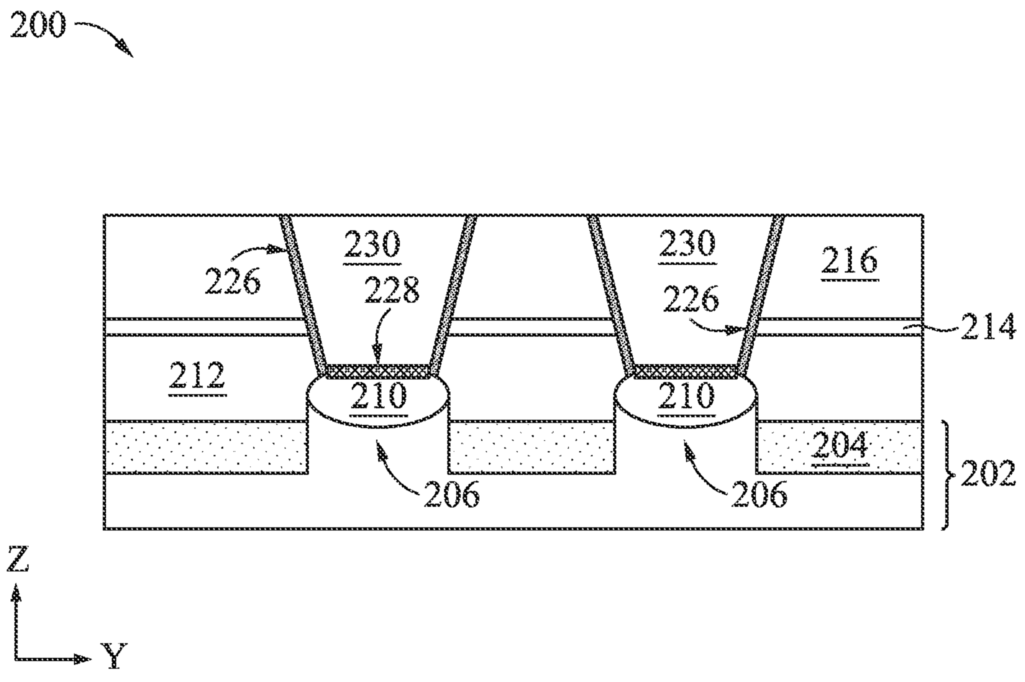

Referring to FIGS. 2, 9A and 9B, the method 100B proceeds to block 118 by filling a metal layer 230 in the trenches 224. The formation may include deposition and a chemical mechanical polishing (CMP) process to remove the excessive metal layer and planarize the top surface. In some embodiments, the metal layer 230 includes tungsten (W), ruthenium (Ru), molybdenum (Mo), cobalt (Co), copper (Cu) or a combination thereof. In some other embodiments, the metal layer 230 includes any suitable conductive material, such as Cu, Co, Ru, W, Mo, Ni, Cr, Ir, Pt, Rh, Ta, Ti, Al, TaN, TiN, compounds, or other suitable conductive materials. In some embodiments the metal layer 230 may be deposited using PVD, CVD, ALD, electroplating, or other suitable deposition process, or combinations thereof.

Figure 10A:
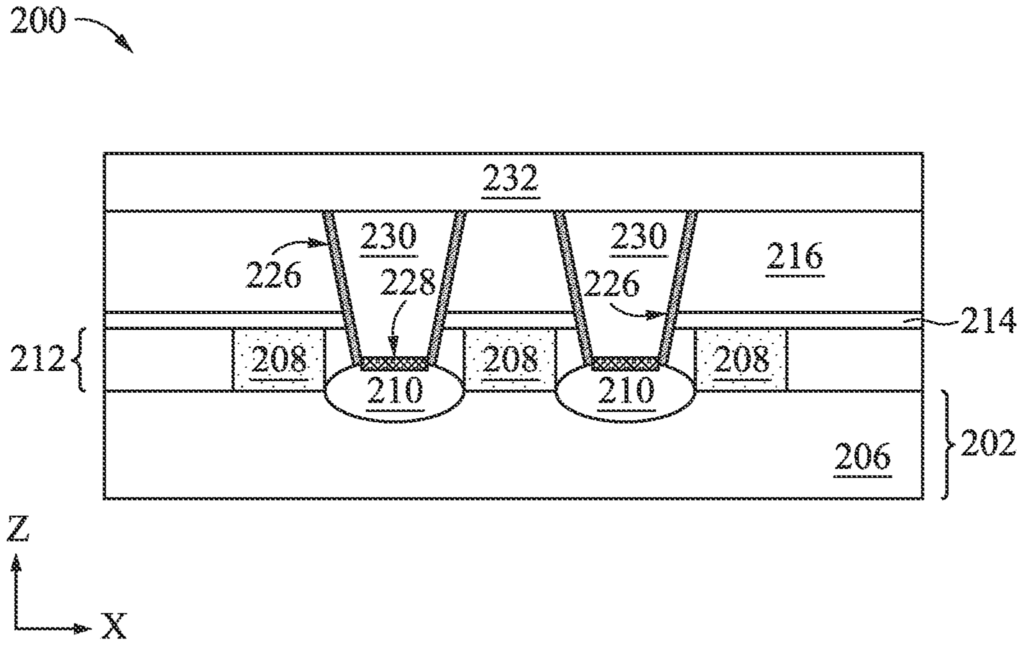
Figure 10B:
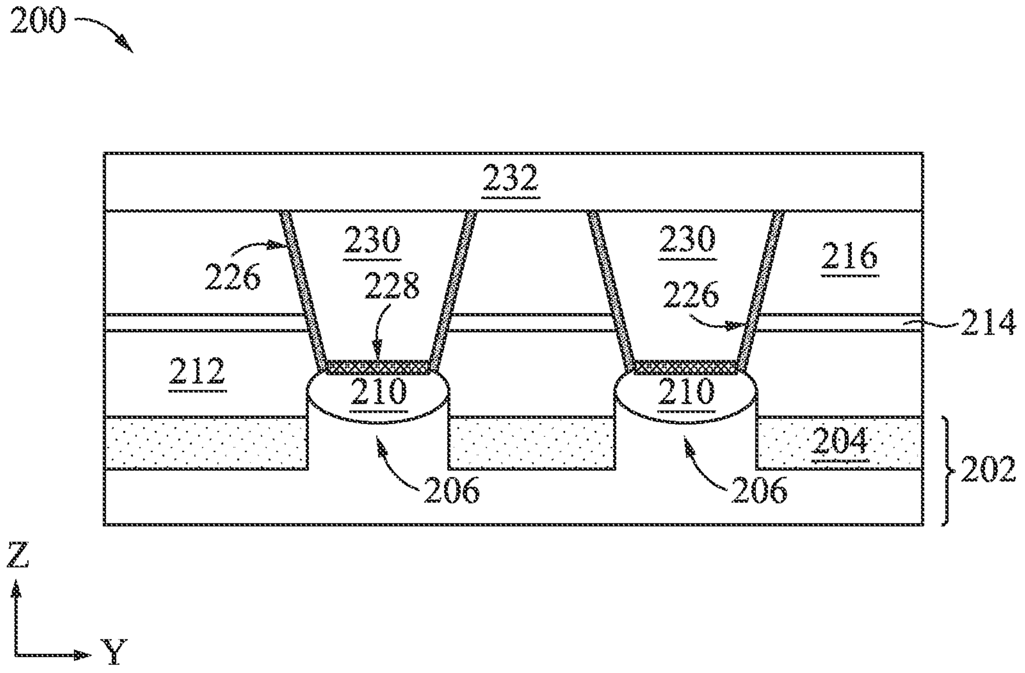

Referring to FIGS. 2, 10A and 10B, the method 100 proceeds to block 120 by depositing one or more material layer 232 as a hard mask. The material layer 232 may include silicon oxide, silicon nitride, silicon oxynitride, other suitable material or a combination thereof. In the disclosed embodiment, the material layer 232 includes a silicon oxide layer and a silicon nitride layer disposed on the silicon oxide layer. In some embodiments the material layer 232 may be deposited using CVD, or other suitable deposition process, or combinations thereof.

Figure 11A:
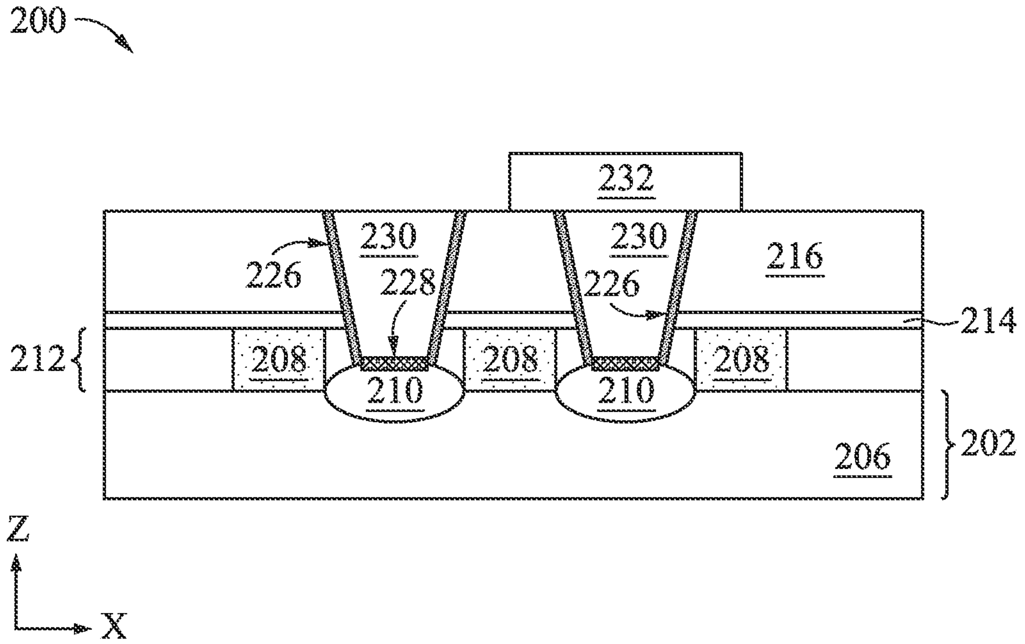
Figure 11B:
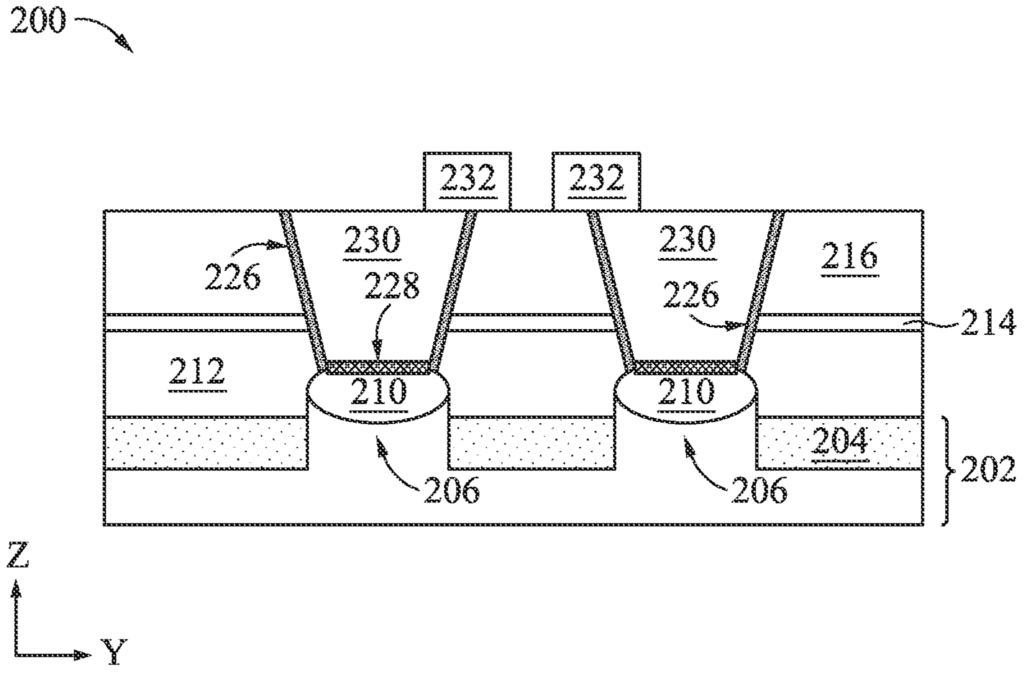

Referring to FIGS. 2, 11A and 11B, the method 100 proceeds to block 122 by patterning the material layer 232. The patterning process is similar to other patterning process described above. For example, the patterning process includes lithography process and etching. The patterned material layer 232 includes openings. The patterned material layer 232 and the ILD layer 216 collectively function as an etch hard mask to define the regions to be etched.

Figure 12A:
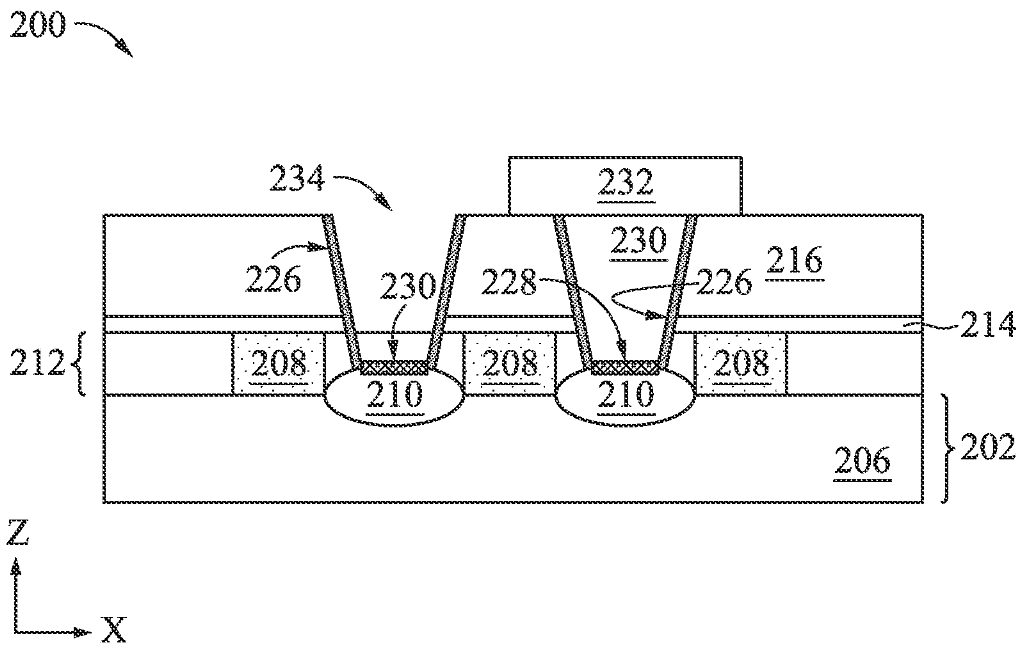
Figure 12B:
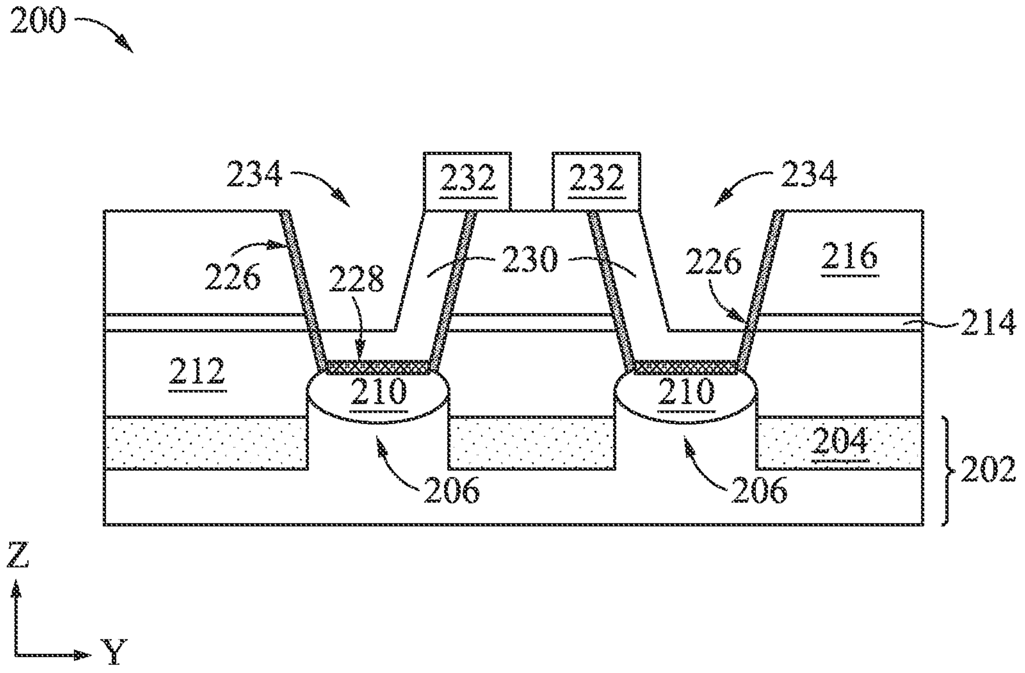

Referring to FIGS. 2, 12A and 12B, the method 100 proceeds to block 124 by etching to recess the metal layer 230 through the openings of the collective hard mask that includes the material layer 232 and the ILD layer 216, thereby forming trenches 234. The etching process applied to the metal layer 230 forms patterned metal structures 230 and trenches 234 therein. In some embodiments, patterning the metal layer 230 includes reactive ion etching, dry etching processes, wet etching processes, other etching processes, or combinations thereof. In some embodiments, etching gas includes Cl-based etching gas (such as $SiCl_2$, $SiCl_4$ or a combination thereof), F-based etching gas (such as $CF_4$, $CF_3$, $C_4F_8$, $NF_3$, or a combination thereof), $N_2$, $O_2$, or a combination thereof depending on metal scheme in the first and second metal layers. In some embodiments, the etching process is controlled with the recessed surface lower than the top surface of the ESL 214. In some embodiments, the etching process is controlled such that the recessed surface is leveling with or lower than the top surface of the ILD layer 212. Accordingly, the bottom surface of the via 70 is leveling with or lower than the bottom surface of the ESL 214. This can be controlled by a suitable technique to check the end point, such as detecting etch exhaust composition or etching time or other suitable method. Thus formed the metal structure 230 includes a top portion as a via 70 and a bottom portion as a contact 68, which will be further described later.

Figure 13A:
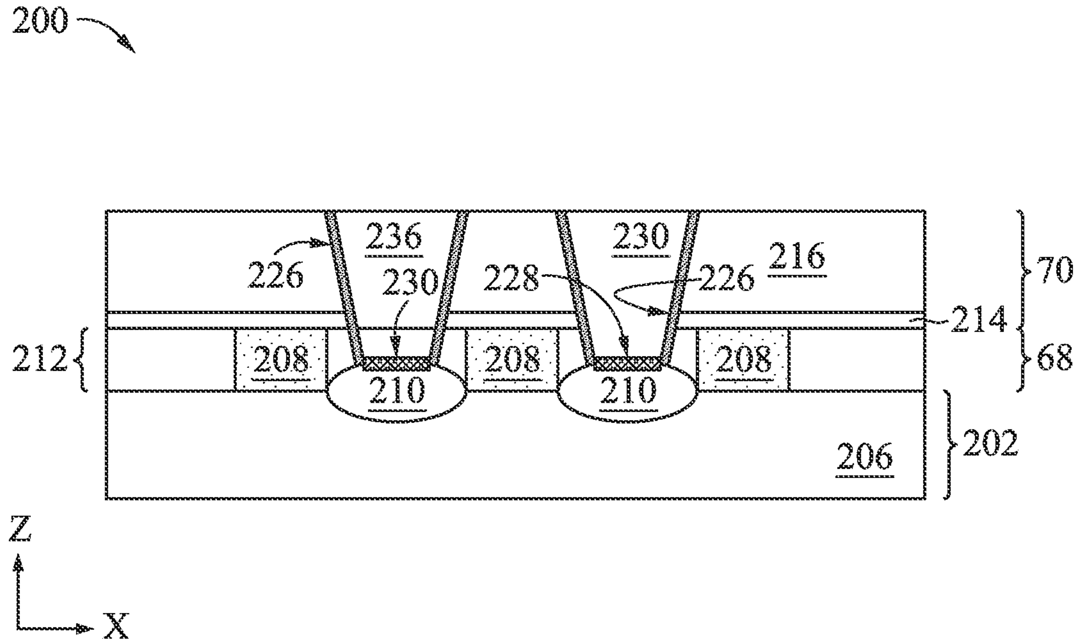
Figure 13B:
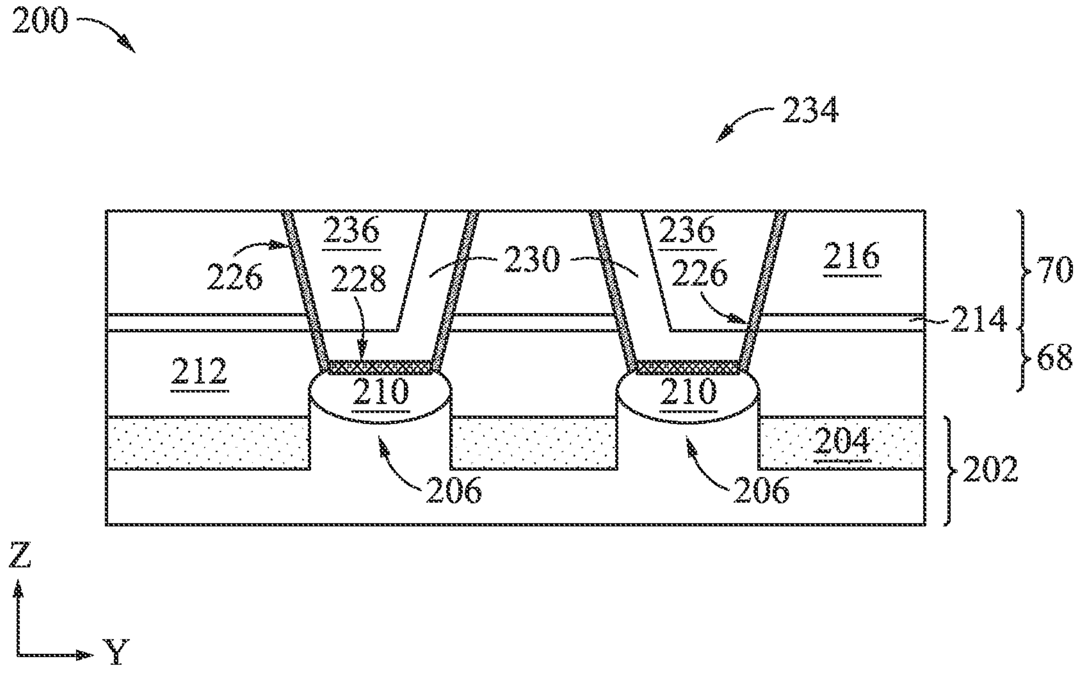

Referring to FIGS. 2, 13A and 13B, the method 100 proceeds to block 126 by refilling a dielectric layer 236 into the trenches 234. The dielectric layer 236 includes silicon carbide (SiC), silicon oxide (SiO), silicon carbon oxynitride (SiCON), other suitable dielectric material or a combination thereof. The dielectric layer 236 is different from the ILD layer 212 and the dielectric liner 226 in composition according to some embodiments. The formation of the dielectric layer 236 includes deposition of the dielectric material and a CMP process to planarize the top surface, according to some embodiments. The deposition includes CVD, flowable CVD, PECVD, other suitable deposition or a combination thereof.

Such formed metal structure 230 includes a bottom portion as a contact 68 and a top portion as a via 70. A pair of the contact 68 and via 70 are self-aligned with each other and have the same composition without interface therebetween to reduce the routing resistance. In some embodiments, the height Hv of the via 70 is less than the height Hc of the contact 68. In furtherance of the embodiments, a height ratio Hv/Hc ranges between 1.2 and 11.

FIG. 14 illustrates a top view of the semiconductor structure 200 in portion according to some embodiments. For example, the ILD layers are not shown in FIG. 14 so that other features can be seen clearly. Especially, the via 70 and the refilled dielectric feature 236 are surrounded by the dielectric liner 226. The contact 68 continuously extended from the via 70 to the source/drain feature 210 and is also surrounded by the dielectric liner 226. The contact 68 is completely overlapped with the via 70 and the refilled dielectric feature 236 in the top view. The dielectric liner 226, the refilled dielectric feature 236 and the ILD layers 212/216 are different from each other in composition. For example, the dielectric liner 226 includes silicon nitride, the refilled dielectric feature 236 includes silicon oxide, and the ILD layers 212/216 includes a low-k dielectric material. Accordingly, the contact 68 is not seen in FIG. 14 in the top view. Especially, the contact 68 longitudinally spans along Y direction between a first end and a second end. The via 70 spans along Y direction between a first edge and a second edge. The first edge is aligned with the first end. The second edge is distanced from the second end and is positioned between the first and second ends. The via 70 is directly overlying the STI structure 204 and is distanced from the active regions 206 in the top view.

As a set of the contact 68, the via 70, the refilled dielectric feature 236 and the dielectric liner 226 are described above, semiconductor structure 200 includes a plurality of sets of the contact 68, the via 70, the refilled dielectric feature 236 and the dielectric liner 226, as illustrated in FIG. 14. For example, a first set is formed on the first active region 206 and a second set is formed on a second active region. The first and second sets are aligned along Y direction and the corresponding vias 70 are formed on the nearby ends of the corresponding contacts 68. The vias 70 and contacts 68 of semiconductor structure 200 may have other configurations, such as one illustrated in FIG. 15, depending on the design and circuit layout.

The present disclosure provides for many different embodiments. In one embodiment, a semiconductor structure and a method of forming the semiconductor structure are provided. The method includes providing a semiconductor substrate; forming a trench to expose a source/drain feature; forming a dielectric liner on sidewalls of the trench; forming a metal layer in the trench; patterning the metal layer to recess a portion of the metal layer; and refilling a dielectric material in the recess, thereby forming a pair of a contact and a via self-aligned with each other and electrically connecting the source/drain feature to overlying interconnect structure through the pair of contact and via. Such formed pair of contact and via are self-aligned and include a same composition without interface therebetween to reduce the resistance.

In one example aspect, the present disclosure provides a method of forming a semiconductor structure. The method includes providing a semiconductor substrate having a source/drain feature and a gate structure formed thereon; forming an interlayer dielectric layer on the semiconductor substrate; patterning the interlayer dielectric layer to form a trench to expose the source/drain feature within the trench; forming a dielectric liner on sidewalls of the trench; filling a metal layer in the trench; recessing a portion of the metal layer in the trench, thereby forming a recess in the metal layer; and refilling a dielectric material layer in the recess.

In another example aspect, the present disclosure provides a method of forming a semiconductor structure. The method includes providing a semiconductor substrate having a source/drain feature and a gate structure formed thereon; forming an interlayer dielectric layer on the semiconductor substrate; patterning the interlayer dielectric layer to form a trench to expose the source/drain feature within the trench; forming a silicide layer on the source/drain feature; filling a metal layer on the silicide layer within the trench; forming a patterned mask with an opening, wherein a first portion of the metal layer is exposed within the opening and a second portion of the metal layer is covered by the patterned mask, and wherein the second portion is extending to the second portion in the trench; and etching the metal layer through the opening of the patterned mask such that the first portion of the metal layer is recessed, and the second portion of the metal layer remains.

In yet another example aspect, the present disclosure provides a semiconductor structure. The semiconductor structure includes a source/drain feature and a gate structure disposed on a semiconductor substrate; an interlayer dielectric layer disposed on the semiconductor substrate; a metal feature of a metal composition embedded in the interlayer dielectric layer and landing on the source/drain feature, wherein the metal feature including a lower portion of a longitudinal shape and a upper portion, and wherein the upper portion is overlying a first longitudinal end of the lower portion and is distanced away from a second longitudinal end of the lower portion; a dielectric material feature overlying the second longitudinal end of the lower portion; and a dielectric liner is disposed on sidewalls of the metal layer and the dielectric material feature. The dielectric liner is different from the interlayer dielectric layer and the dielectric material feature in composition. The dielectric liner is enclosing the metal feature and the dielectric material feature in a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

providing a semiconductor substrate having a source/drain feature and a gate structure formed thereon;

forming a dielectric stack on the semiconductor substrate, wherein the dielectric stack includes a first interlayer dielectric layer, an etch stop layer on the first interlayer dielectric layer, and a second interlayer dielectric layer on the etch stop layer;

patterning the dielectric stack to form a trench penetrating through the first interlayer dielectric layer, the etch stop layer and the second interlayer dielectric layer to expose the source/drain feature within the trench;

forming a dielectric liner on sidewalls of the trench;

filling a metal layer in the trench;

recessing a first portion of the metal layer in the trench, thereby forming a recess in the metal layer while a second portion of the metal layer in the trench remains; and refilling a dielectric material layer in the recess.

2. The method of claim 1, wherein the recessing the first portion of the metal layer includes etching the first portion of the metal layer thereby forming a contact and a via self-aligned with the contact.

3. The method of claim 2, wherein the dielectric material layer is different from the dielectric liner and the first and second interlayer dielectric layers in composition.

4. The method of claim 3, wherein the dielectric material layer includes silicon nitride;

the dielectric liner includes at least one of silicon oxide and silicon oxynitride; and each of the first and second interlayer dielectric layers includes a low-k dielectric material.

5. The method of claim 1, wherein the forming the dielectric liner includes depositing a dielectric film on surfaces of the trench and applying an anisotropic etch to the dielectric film.

6. The method of claim 1, the recessing the first portion of the metal layer in the trench includes forming a patterned dielectric layer by a lithography process and an etching process; and recessing the metal layer using the second interlayer dielectric layer and the patterned dielectric layer as a collective etch mask.

7. The method of claim 6, wherein the recessing the first portion of the metal layer in the trench includes recessing the first portion of the metal layer such that a top surface of the recessed first portion of the metal layer is below a bottom surface of the etch stop layer.

8. The method of claim 1, wherein the refilling of the dielectric material layer in the recess includes depositing the dielectric material layer in the recess; and performing a chemical mechanical polishing process to the dielectric material layer.

9. The method of claim 1, wherein the dielectric liner is enclosing the dielectric material layer and the metal layer in a top view.

10. The method of claim 2, wherein the contact is overlapped with the dielectric material layer and the via in a top view.

11. A method of forming a semiconductor structure, comprising:

providing a semiconductor substrate having a source/drain feature and a gate structure formed thereon;

forming a dielectric stack on the semiconductor substrate, wherein the dielectric stack includes a first interlayer dielectric layer, an etch stop layer on the first interlayer dielectric layer, and a second interlayer dielectric layer on the etch stop layer;

etching through the dielectric stack to form a trench to expose the source/drain feature within the trench;

forming a silicide layer on the source/drain feature;

filling a metal layer on the silicide layer within the trench, the metal layer contacting the first interlayer dielectric layer, the etch stop layer, and the second interlayer dielectric layer;

forming a patterned mask with an opening, wherein a first portion of the metal layer is exposed within the opening and a second portion of the metal layer is covered by the patterned mask, and wherein the second portion is extending to the first portion in the trench; and etching the metal layer through the opening of the patterned mask such that the first portion of the metal layer is recessed, and the second portion of the metal layer remains.

12. The method of claim 11, further comprising forming a dielectric liner on sidewalls of the trench prior to the filling the metal layer in the trench; and refilling a dielectric material layer in the recess after the etching the metal layer.

13. The method of claim 12, wherein the dielectric liner is enclosing the dielectric material layer and the metal layer in a top view; and the contact is completely overlapped with the dielectric material layer and the via in a top view.

14. The method of claim 12, wherein the dielectric material layer is different from the dielectric liner and the first and second interlayer dielectric layers in composition; and the dielectric liner is continuously extending from a sidewall of the second portion of the metal layer from top to bottom.

15. The method of claim 14, wherein the forming the dielectric liner includes depositing a dielectric film on surfaces of the trench and applying an anisotropic etch to the dielectric film.

16. The method of claim 11, wherein the etching the metal layer includes recessing the first portion of the metal layer such that a top surface of the recessed first portion of the metal layer is below a top surface of the etch stop layer.

17. A method of forming a semiconductor structure, comprising:

providing a semiconductor substrate that includes a first and second active regions each being longitudinally oriented along a first direction, and a first and second gate structures each being longitudinally oriented along a second direction perpendicular to the first direction;

forming a dielectric stack on the semiconductor substrate, wherein the dielectric stack includes a first interlayer dielectric layer, an etch stop layer on the first interlayer dielectric layer, and a second interlayer dielectric layer on the etch stop layer;

etching through the dielectric stack to form a trench to expose a source/drain feature within the trench;

forming a dielectric liner on sidewalls of the trench;

forming a silicide layer on the source/drain feature;

filling a metal layer on the silicide layer and dielectric liner within the trench;

forming a patterned mask with an opening, wherein a first portion of the metal layer is exposed within the opening and a second portion of the metal layer is covered by the patterned mask, and wherein the second portion is extending to the first portion in the opening; and etching the metal layer through the opening of the patterned mask such that the first portion of the metal layer is recessed to form a recess, and the second portion of the metal layer remains, thereby forming a contact and a via self-aligned with the contact; and refilling a dielectric material layer in the recess, wherein the contact is longitudinally oriented along the second direction, and wherein the via is distanced from the first and second active regions, and is interposed between the first and second active regions in a top view.

18. The method of claim 17, wherein the contact is overlapped with the dielectric material layer and the via in a top view;

the dielectric material layer includes silicon nitride;

the dielectric liner includes at least one of silicon oxide and silicon oxynitride; and each of the first and second interlayer dielectric layers includes a low-k dielectric material.

19. The method of claim 17, wherein the forming the dielectric liner includes depositing a dielectric film on surfaces of the trench and applying an anisotropic etch to the dielectric film;

and the etching of the metal layer includes recessing the first portion of the metal layer such that a top surface of the recessed portion of the metal layer is below a bottom surface of the etch stop layer.

20. The method of claim 17, wherein the trench is a first trench, the source/drain feature is a first source/drain feature, and the opening is a first opening;

the etching through the dielectric stack further includes etching through the dielectric stack to form a second trench to expose a second source/drain feature within the second trench;

the filling of the metal layer further includes filling the metal within the second trench;

the forming of the patterned mask further includes forming the patterned mask with a second opening, wherein a third portion of the metal layer is exposed within the second opening and a fourth portion of the metal layer is covered by the patterned mask, and wherein the fourth portion is extending to the third portion in the second trench;

the etching of the metal layer further includes etching the metal through the second opening of the patterned mask such that the third portion of the metal layer is recessed, and the fourth portion of the metal layer remains, thereby forming a second contact and a second via self-aligned with the second contact;

the second contact is longitudinally oriented along the second direction; and the second via is distanced from the first and second active regions, and is interposed between the first and second active regions in the top view.

* * * * *